(12) United States Patent
Nakamura et al.

(10) Patent No.: US 7,888,239 B2
(45) Date of Patent: Feb. 15, 2011

(54) SEMICONDUCTOR DEVICE MANUFACTURING METHOD

(75) Inventors: Masaru Nakamura, Ota-ku (JP);
Masatoshi Wakahara, Ota-ku (JP);
Motoko Nakayama, Ota-ku (JP); Yuki Nakamura, Ota-Ku (JP)

(73) Assignee: Disco Corporation, Tokyo (JP)

( * ) Notice: Subject to any disclaimer, the term of this patent is extended or adjusted under 35 U.S.C. 154(b) by 69 days.

(21) Appl. No.: 12/496,406

(22) Filed: Jul. 1, 2009

(65) Prior Publication Data
US 2010/0015784 A1 Jan. 21, 2010

(30) Foreign Application Priority Data
Jul. 18, 2008 (JP) .............................. 2008-187423

(51) Int. Cl.
*H01L 21/78* (2006.01)
*H01L 21/46* (2006.01)
(52) U.S. Cl. ....................... 438/464; 438/462; 438/463; 257/E21.599
(58) Field of Classification Search ................. 438/462, 438/463, 464
See application file for complete search history.

(56) References Cited

U.S. PATENT DOCUMENTS

| | | | | |
|---|---|---|---|---|
| 6,652,707 | B2 * | 11/2003 | Ishaug et al. ................. | 156/344 |
| 7,431,705 | B2 * | 10/2008 | Wilkins ........................ | 601/46 |
| 7,727,785 | B2 * | 6/2010 | Connell et al. ................ | 438/24 |
| 2006/0051938 | A1 * | 3/2006 | Connell et al. .............. | 438/460 |
| 2007/0023136 | A1 * | 2/2007 | Priewasser ................ | 156/272.8 |
| 2008/0003780 | A1 * | 1/2008 | Sun et al. ..................... | 438/464 |
| 2008/0293218 | A1 * | 11/2008 | Nakamura ................... | 438/460 |
| 2009/0186216 | A1 * | 7/2009 | Inada et al. ................. | 428/337 |
| 2009/0311849 | A1 * | 12/2009 | Andry et al. ................. | 438/464 |

FOREIGN PATENT DOCUMENTS

| | | |
|---|---|---|
| JP | A 2000-182995 | 6/2000 |
| JP | A 2002-118081 | 4/2002 |

* cited by examiner

*Primary Examiner*—Alexander G Ghyka
(74) *Attorney, Agent, or Firm*—Greer, Burns & Crain, Ltd

(57) ABSTRACT

In a semiconductor device manufacturing method in which a wafer formed with devices in a plurality of areas sectioned by a plurality of streets formed in a lattice-like pattern on the front surface is divided into the individual devices along the streets, when the wafer is divided into the individual devices by exposing cut grooves formed along the streets by a dicing before grinding process, a rigid plate is applied to the front surface of the wafer and an adhesive film is attached to the rear surface of the wafer. Thereafter, a separation groove forming step is performed in which a laser beam is directed to the adhesive film along the cut grooves from the dicing tape side applied with the wafer attached with the adhesive film to form separation grooves in the adhesive film along the cut grooves.

2 Claims, 12 Drawing Sheets

SEMICONDUCTOR DEVICE MANUFACTURING METHOD

BACKGROUND OF THE INVENTION

1. Field of the Invention

The present invention relates to a semiconductor device manufacturing method in which a wafer formed with devices in a plurality of areas sectioned by streets formed in a lattice like pattern on the front surface thereof is divided into the individual devices along the streets and a die bonding adhesive film is attached to the rear surface of each of the devices.

2. Description of the Related Art

For example, in a semiconductor device manufacturing step, devices such as ICs, LSIs or the like are formed in a plurality of areas sectioned by predetermined dividing lines (streets) formed in a lattice-like pattern on the front surface of a generally disk-shaped semiconductor wafer. The areas formed with the devices are divided along the streets. Thus, the individual semiconductor devices are manufactured. A dicing device is generally used as a dividing device for dividing the semiconductor wafer. The dicing device cuts the semiconductor wafer along the streets by means of a cutting blade with a thickness of approximately 20 μm. The semiconductor devices divided as described above are widely used in electric devices such as mobile phones, personal computers, etc.

The individually divided semiconductor devices are each attached on the rear surface with a die bonding adhesive film called a die attach film. The die bonding adhesive film is formed of a polyimide-based resin, an epoxy-base resin, an acryl-based resin or the like to have a thickness of 20 to 40 μm. Further, the individually divided semiconductors are bonded, by heating, to a die bonding frame supporting the semiconductor devices via the adhesive film. One of methods of attaching a die bonding adhesive film to the rear surface of a semiconductor device is as below. An adhesive film is applied to the rear surface of a semiconductor wafer. The semiconductor wafer is applied to a dicing tape via the adhesive film. Thereafter, the semiconductor wafer is cut together with the adhesive film by a cutting blade along streets formed on the front surface of the semiconductor wafer. Thus, the semiconductor devices attached with the adhesive films on the rear surface are formed. (See e.g. Japanese Patent Laid-Open No. 2000-182995.)

According to the method disclosed in Japanese Patent Laid-Open No. 2000-182995, however, when the semiconductor wafer is cut together with the adhesive film by means of the cutting blade and divided into the individual semiconductor devices, the rear surface of the semiconductor device may cause a chip or the adhesive film may cause beard-like burrs. This poses a problem of disconnection occurring during wire bonding.

In recent years, electric devices such as mobile phones, personal computers, etc. have required weight reduction and downsizing, which has required thinner semiconductor devices. A dividing technique called the so-called dicing before grinding process is put to practical use as a technique for dividing semiconductor devices thinner. The dicing before grinding process is a technique as below. Cut grooves are formed along streets at a given depth (the depth corresponding to the finish thickness of the semiconductor device) from the front surface of the semiconductor wafer. Thereafter, the semiconductor wafer formed with the cut grooves on the front surface is ground from its rear surface to expose the cut grooves to the rear surface. Thus, the semiconductor wafer is divided into individual semiconductor devices. The semiconductor devices can each be processed to have a thickness of 50 μm or less.

The semiconductor wafer is divided into the individual semiconductor devices by the dicing before grinding process. In such a case, however, the cut grooves are formed along the streets to have the given depth from the front surface of the semiconductor wafer. Thereafter, the semiconductor wafer is ground from the rear surface to expose the cut grooves to the rear surface. Therefore, a die bonding adhesive film cannot previously be attached to the rear surface of the semiconductor wafer. Thus, when the semiconductor device is bonded, by the dicing before grinding process, to the die bonding frame supporting the semiconductor device, the die bonding has to be performed while pouring bond between the semiconductor device and the die bonding frame. This poses a problem in that bonding work cannot be performed smoothly.

To solve such a problem, a semiconductor device manufacturing method as described below is proposed. In this method, a die bonding adhesive film is attached to the rear surface of a wafer which is divided into individual semiconductor devices by the dicing before grinding process. The semiconductor devices are attached to a dicing tape via the adhesive film. Thereafter, a laser beam is directed to a portion of the adhesive film exposed to the gap between the semiconductor devices, from the front surface side of the semiconductor device via the gap. Thus, the portion of the adhesive film exposed to the gap between is removed. (See e.g. Japanese Patent Laid-Open No. 2002-118081.)

In this way, a laser beam is directed to the die bonding adhesive film attached to the rear surface of the wafer divided into the individual semiconductor devices, through the gap between the semiconductor devices for fusion-cutting the adhesive film. In this case, debris fly off and attach to the front surface of the device, which poses a problem of degrading the quality of the semiconductor device.

A protection tape is applied to the front surface of a wafer formed with cut grooves, and the wafer is ground from its rear surface and divided into individual semiconductor devices. In this case, the individually divided semiconductor devices shift so that the cut grooves meander. This poses a problem in that it is difficult to direct a laser beam through the gap between the semiconductor devices after the die bonding adhesive film has been attached to the rear surface of the individually divided semiconductor devices.

SUMMARY OF THE INVENTION

Accordingly, it is an object of the present invention to provide a semiconductor device manufacturing method that can attach a die bonding adhesive film to the rear surfaces of individual devices divided by a dicing before grinding process without degrading the quality of the devices.

In accordance with an aspect of the present invention, there is provided a semiconductor device manufacturing method in which a wafer formed with devices in a plurality of respective areas sectioned by a plurality of streets formed in a lattice-like pattern on a front surface is divided into the individual devices along the streets, the method including: a cut groove forming step of forming cut grooves each having a depth corresponding to a finish thickness of the device along the streets from a front surface side of the wafer; a rigid plate applying step of applying a rigid plate with rigidity to the front surface of the wafer formed with the cut grooves; a wafer dividing step of grinding a rear surface of the wafer applied with the rigid plate to expose the cut grooves to the rear surface and dividing the wafer into the individual devices; an adhesive film attaching step of attaching an adhesive film to the rear surface of the wafer divided into the individual devices and allowing a dicing tape attached to an annular frame to support the wafer attached with the adhesive film; a separation groove forming step of, after the adhesive film attaching step has been performed, emitting a laser beam to the adhesive film along the cut grooves from the dicing tape side to form separation grooves in the adhesive film along the cut grooves; a rigid plate peeling step of, after the separation groove forming step has been performed, peeling the rigid plate applied to the front surface of the wafer; and a picking-up step of peeling off and picking up the devices from the dicing tape, the devices each being attached with the adhesion film formed with separation grooves along the respective cut grooves by performing the separation groove forming step.

Preferably, the picking-up step is performed by expanding the dicing tape to broaden a gap between the individually divided devices.

According to the present invention, by performing the wafer dividing step by the so-called dicing before grinding process, the cut grooves formed along the streets are exposed to divide the wafer into the individual devices. The adhesive film is attached to the rear surface of the wafer. Then the separation groove forming step is performed in which a laser beam is directed to the adhesive film along the cut grooves from the dicing tape side applied with the wafer attached with the adhesive film to form separation grooves in the adhesive film. In this case, since the rigid plate is applied to the front surface of the wafer, the individually divided devices will not be shifted. Therefore, the gap resulting from the cut groove formed along the street will not meander. Thus, a laser beam can be directed along the cut groove. In the separation groove forming step, when the adhesive film is fused, debris fly off. However, since the rigid plate is applied to the front surface of the wafer, the flying debris will not attach to the devices formed on the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
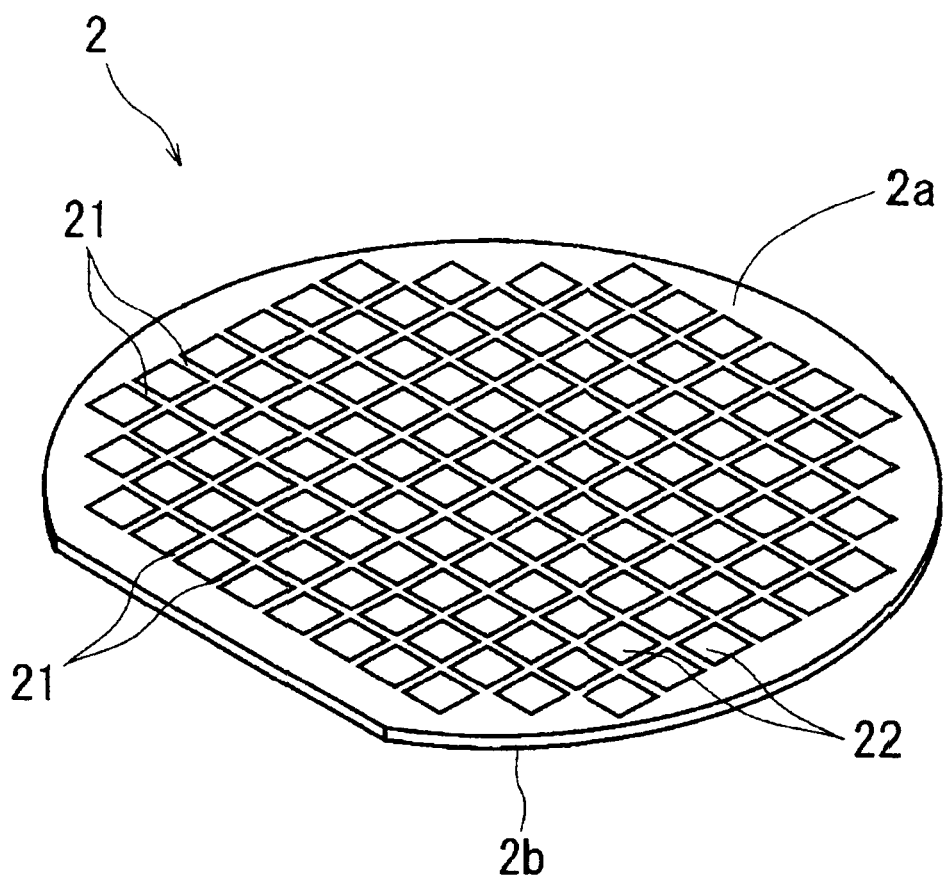
FIG. 1 is a perspective view of a semiconductor wafer as a wafer.

Preferred embodiments of a semiconductor device manufacturing method according to the present invention will hereinafter be described in detail with reference to the accompanying drawings. FIG. 1 is a perspective view of a semiconductor wafer as a wafer. The semiconductor wafer 2 illustrated in FIG. 1 is a silicon wafer with a thickness of e.g. 600 μm and has a front surface 2a formed thereon with a plurality of streets 21 in a lattice-like pattern. On the front surface 2a of the semiconductor wafer 2 devices 22 such as ICs, LSIs, etc., are formed in a plurality of areas sectioned by the plurality of streets 21 formed in a lattice-like pattern. A description is given of a procedure for dividing the semiconductor wafer 2 into individual semiconductor devices by a dicing before grinding process.

Figure 2A:
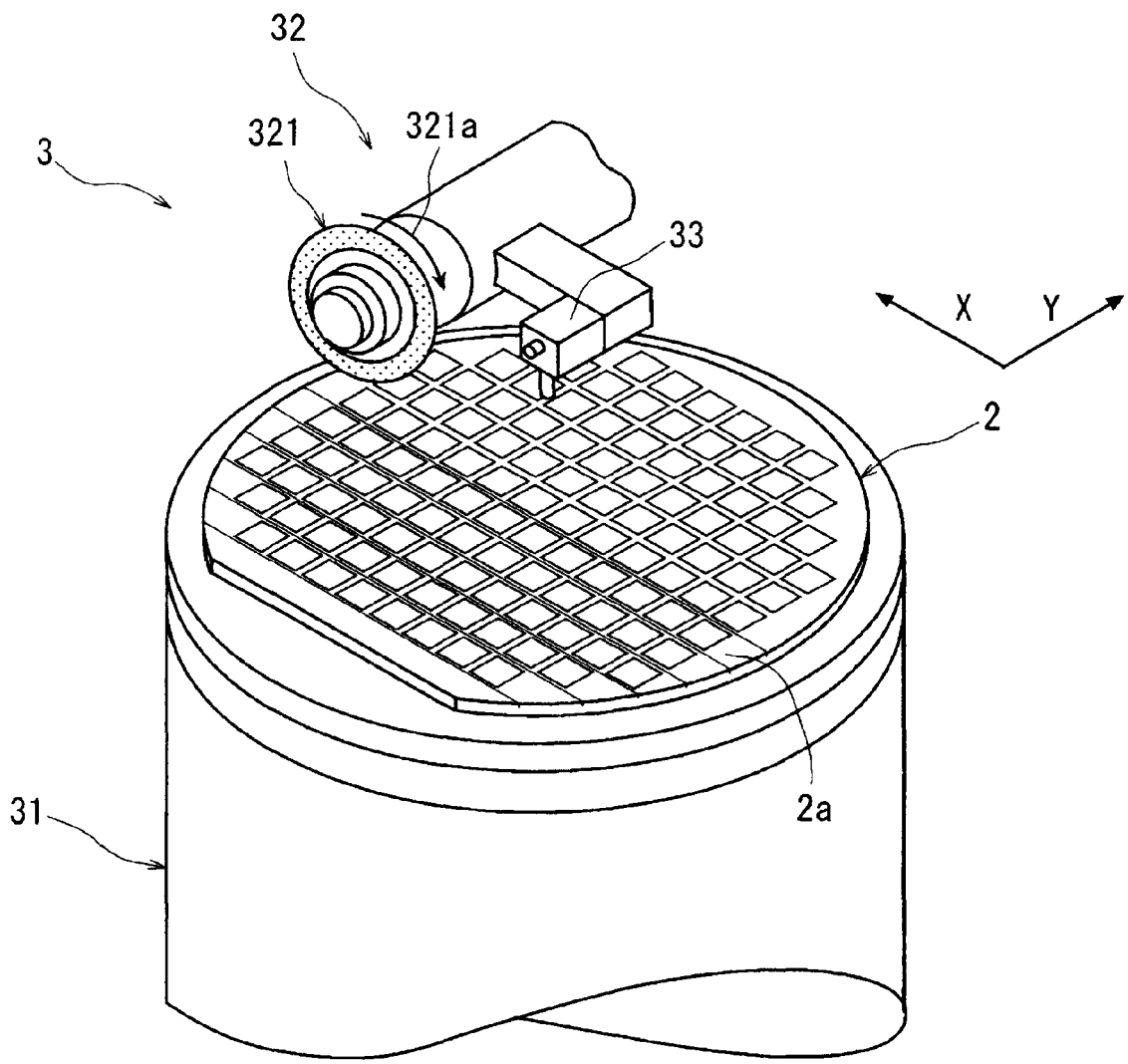
FIGS. 2A and 2B are explanatory views of a division groove forming step in a wafer dividing step of a device manufacturing method according to the present invention.

To divide the semiconductor wafer 2 into individual semiconductor devices by the dicing before grinding process, cutting grooves are first formed along the streets 21 formed on the front surface 2a of the semiconductor wafer 2 so as to have a given depth (the depth corresponding to the finish thickness of each device) (the cut groove forming step). The cut groove forming step is performed using a cutting device 3 illustrated in FIG. 2A. The cutting device 3 illustrated in FIG. 2A includes a chuck table 31 adapted to hold a workpiece; a cutting means 32 provided with a cutting blade 321; and an image picking-up means 33. To perform the cut groove forming step by the cutting device 3, the semiconductor wafer 2 is placed on the chuck table 31 with the front surface 2a facing up. Then, the semiconductor wafer 2 is held on the chuck table 31 by operating a sucking means not illustrated. In this way, the chuck table 31 sucking and holding the semiconductor wafer 2 is positioned immediately below the image picking-up means 33 by a cutting-transfer mechanism not illustrated.

After the chuck table 31 has been positioned immediately below the image picking-up means 33, the image picking-up means 33 and a control means not illustrated perform alignment work for detecting a cut area to be formed with the cut groove of the semiconductor wafer 2. Specifically, the image picking-up means 33 and the control means perform image processing such as pattern matching or the like for alignment between the cutting blade 321 and the street 21 formed to extend in a given direction of the semiconductor wafer 2, thus executing the alignment of the cut area (an alignment step). Similarly, the alignment of the cut area is executed on a predetermined dividing line or street 21 extending perpendicularly to the above-mentioned given direction formed on the semiconductor wafer 2.

Figure 2B:
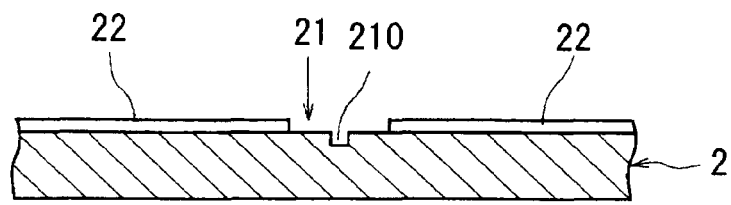
Figure 3A:
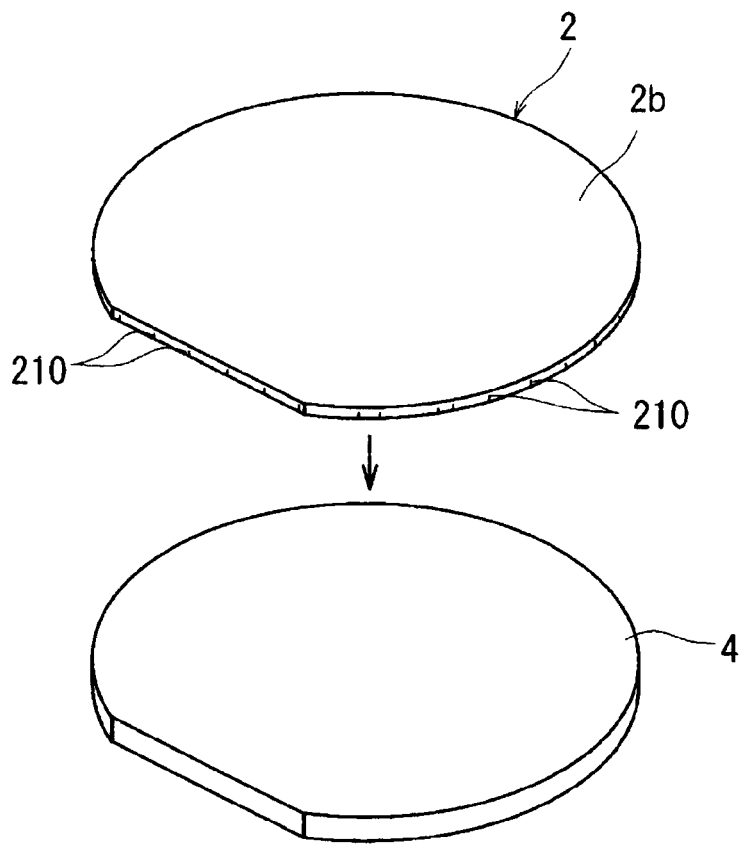
FIGS. 3A and 3B are explanatory views of a protection film applying step in the wafer dividing step of the device manufacturing method according to the present invention.
Figure 3B:
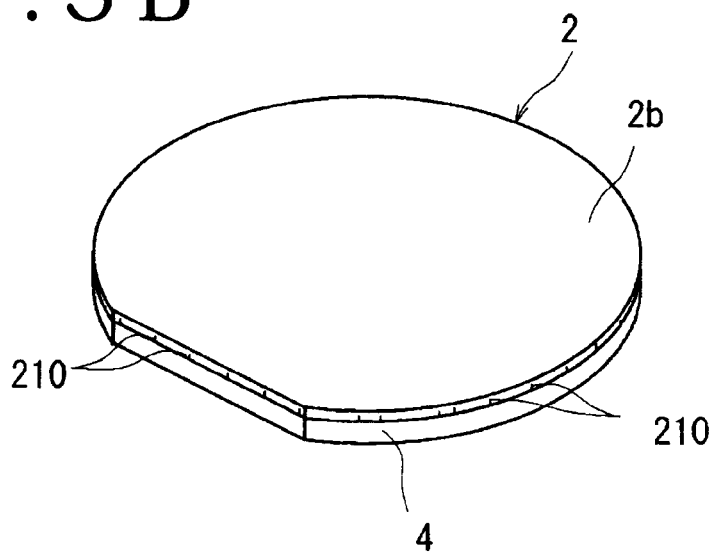

After the alignment has been performed on the cut area of the semiconductor wafer 2 held on the chuck table 31 as described above, the chuck table 31 holding the semiconductor wafer 2 is shifted to the cut-start position of the cut area. Then, while being rotated in the direction indicated with arrow 321*a* in FIG. 2A, the cutting blade 321 is shifted downward and incision-transfer is performed by a given amount. The position of the incision-transfer is such that the outer circumferential edge of the cutting blade 321 is set at a depth-position (e.g. 110 μm) corresponding to the finish thickness of the device from the front surface of the semiconductor wafer 2. The incision-transfer of the cutting blade 321 is performed as described above. Thereafter, while the cutting blade 321 is rotated, the chuck table 31 is cutting-transferred in the direction indicated with arrow X in FIG. 2A to form a cut groove 210 with a depth (e.g. 110 μm) corresponding to the finish thickness of the device along the street 21 as illustrated in FIG. 2B (the cut groove forming step). This cut groove forming step is performed on all the streets 21 formed on the semiconductor wafer 2.

The cut grooves 210 with the given depth are formed along the streets 21 on the front surface 2*a* of the semiconductor wafer 2 by the cut groove forming step described above. Thereafter, a rigid plate 4 having rigidity for protecting the devices 22 is applied to the front surface 2*a* (the surface formed with the devices 22) of the semiconductor wafer 2 via a suitable adhesive (a rigid plate applying step). Incidentally, the rigid plate 4 can use a glass plate, a ceramic plate or a metal plate having a thickness of 0.5 to 1.5 mm.

Figure 4A:
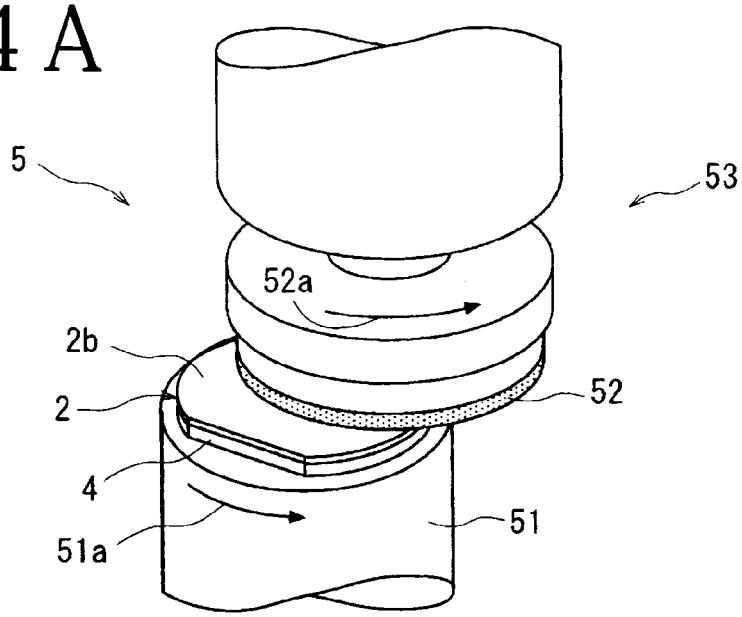
FIGS. 4A to 4C are explanatory views of a division groove exposing step in the wafer dividing step of the device manufacturing method according to the present invention.

Next, a wafer dividing step is performed in which a rear surface 2*b* of the semiconductor wafer 2 applied with the rigid plate 4 on the front surface thereof is ground to expose the cut grooves 210 to the rear surface 2*b*, whereby the semiconductor wafer 2 is divided into individual devices. This wafer dividing step is performed using a grinding device 5 illustrated in FIG. 4A. The grinding device 5 illustrated in FIG. 4A includes a chuck table 51 adapted to hold a workpiece; and a grinding means 53 provided with a grinding wheel 52. To perform the wafer dividing step using the grinding device 5, the semiconductor wafer 2 is placed on the chuck table 51 with the rear surface 2*b* facing up. Then, the semiconductor wafer 2 is sucked and held onto the semiconductor wafer 2 by operating a sucking means not illustrated.

Figure 4B:
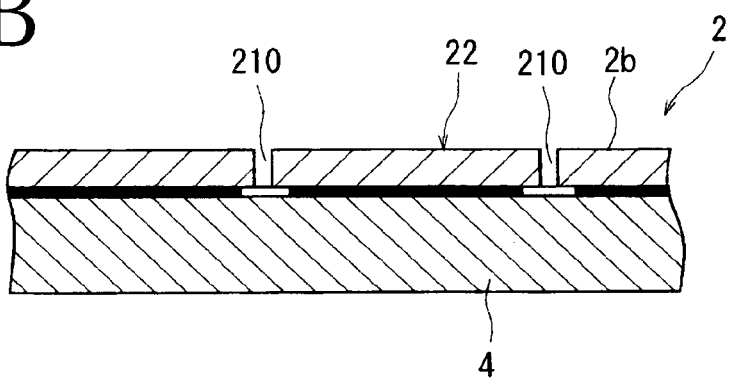
Figure 4C:
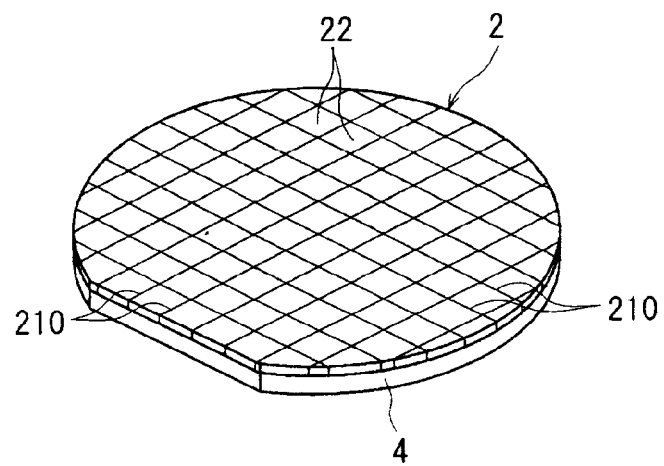

Then, while the chuck table 51 is rotated in the direction indicated with arrow 51*a* at 300 rpm, the grinding wheel 52 of the grinding means 53 is rotated in the direction indicated with arrow 52*a* at 600 rpm and brought into contact with the rear surface 2*b* of the semiconductor wafer 2 for grinding. The grinding is continued until the cut groove 210 is exposed to the rear surface 2*b* as illustrated in FIG. 4B. By continuing the grinding until the cut grooves 210 are exposed, the semiconductor wafer 2 is divided into individual devices 22 as illustrated in FIG. 4C. Incidentally, the plurality of devices thus divided are applied with the rigid plate 4 on the front surface; therefore, they will not be shifted so that the cut grooves 210 will not meander.

Figure 5A:
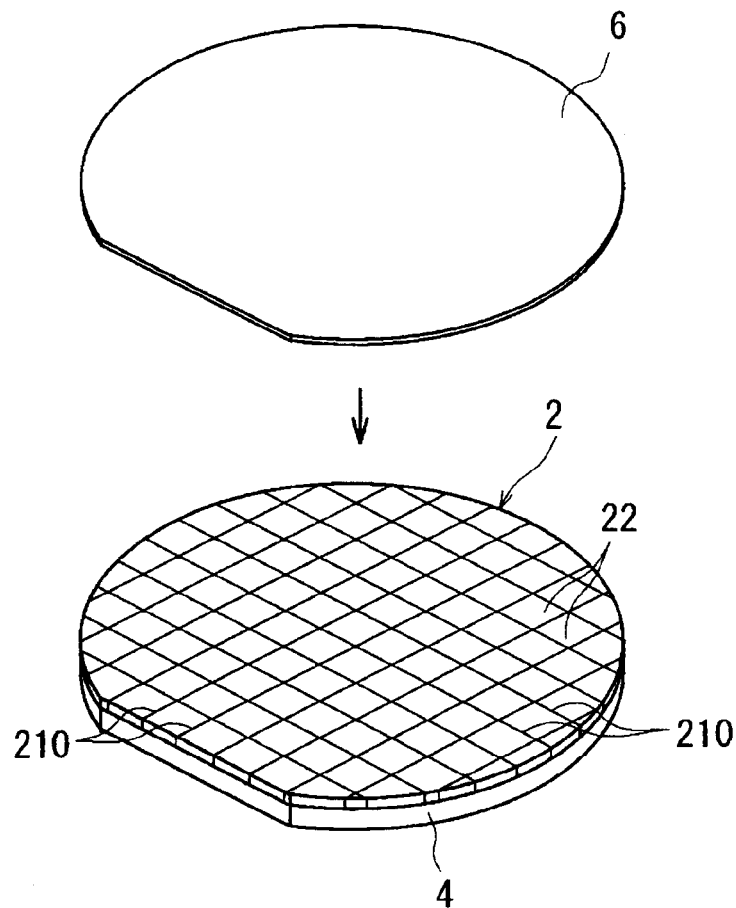
FIGS. 5A and 5B are explanatory views of an adhesive film attaching step in the device manufacturing method according to the present invention.
Figure 5B:
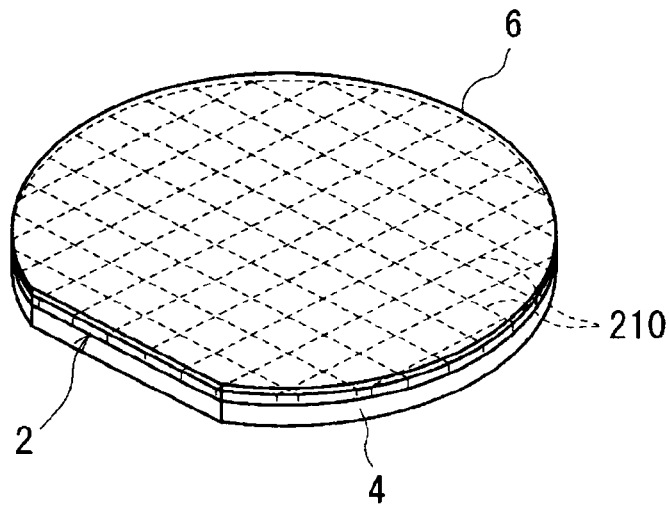

After the semiconductor wafer 2 has been divided into the individual devices 22 by the dicing before grinding process mentioned above, an adhesive film bonding step is performed. In this step, a die bonding adhesive film is attached to the rear surface 2*b* of the semiconductor wafer 2 divided into the individual devices 22. As illustrated in FIGS. 5A and 5B, an adhesive film 6 is attached to the rear surface 2*b* of the semiconductor wafer 2 divided into the individual devices 22.

In this case, while heating the adhesive film 6 at a temperature of 80 to 200° C., the adhesive film 6 is pressed against and applied to the rear surface of the semiconductor wafer 2. Incidentally, the adhesive film 6 is made of a film material formed of an epoxy-based resin to have a thickness of 20 μm.

Figure 6A:
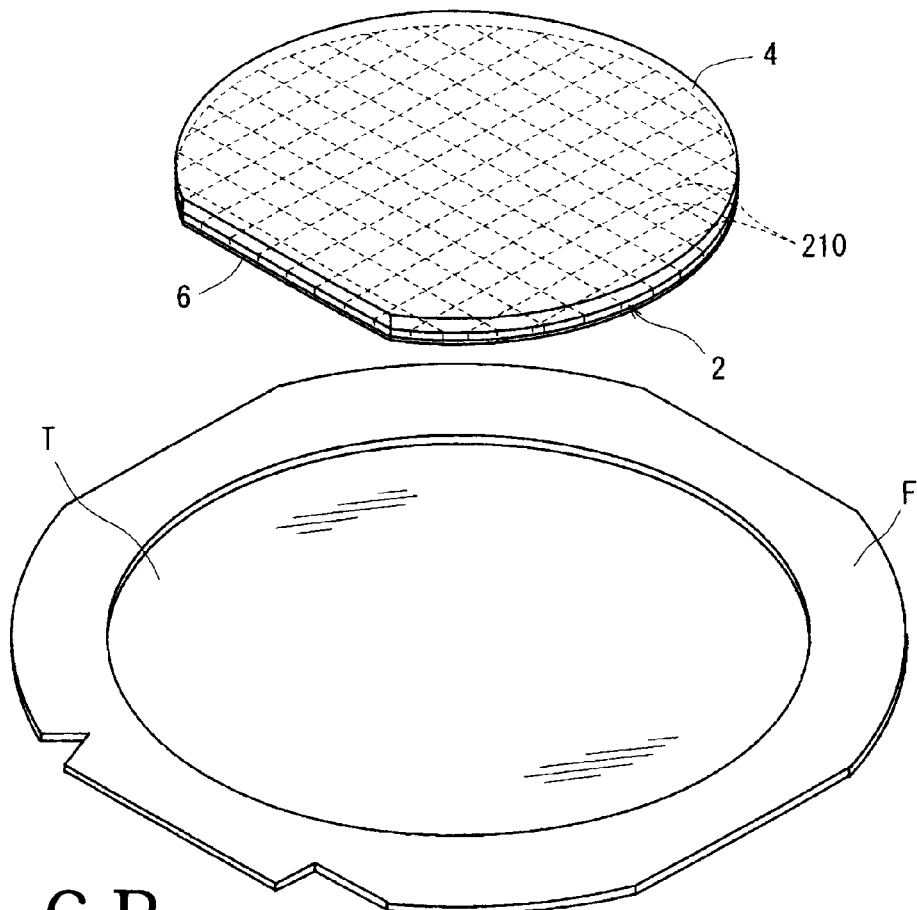
FIGS. 6A and 6B are explanatory views of a wafer support step in the device manufacturing method according to the present invention.
Figure 6B:
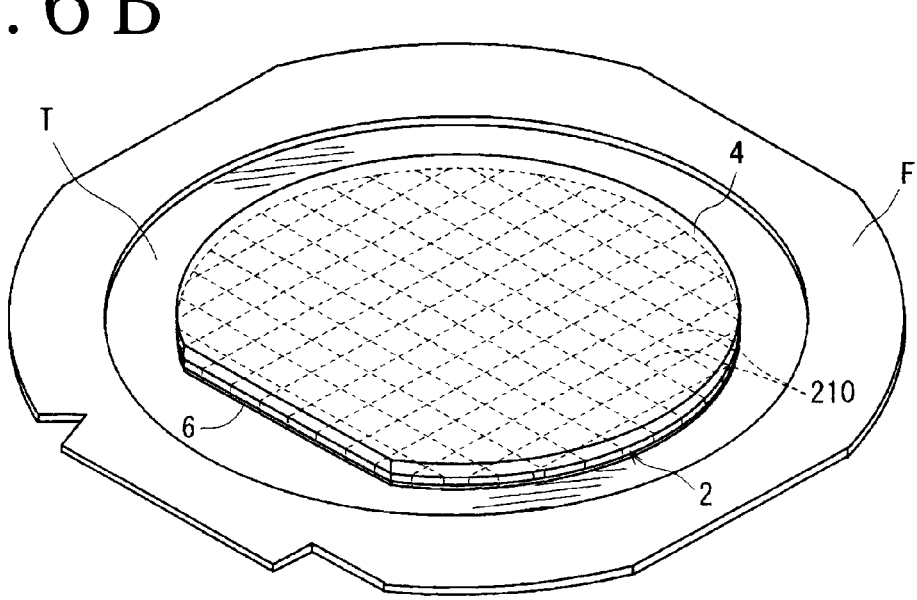

After the adhesive film attaching step mentioned above has been performed, a wafer supporting step is performed in which the semiconductor wafer 2 attached with the adhesive film 6 is applied on the side of the adhesive film 6 to an expandable dicing tape attached to an annular frame. Specifically, as illustrated in FIGS. 6A and 6B, the semiconductor wafer 2 is applied on the side of the adhesive film 6 to the front surface of the dicing tape T attached at an outer circumferential portion to cover the inside opening portion of the annular frame F. Therefore, the rigid plate 4 applied to the front surface of the semiconductor wafer 2 faces upward. Incidentally, the dicing tape T is formed of a polyolefin sheet with a thickness of 95 μm in the illustrated embodiment.

Figure 7A:
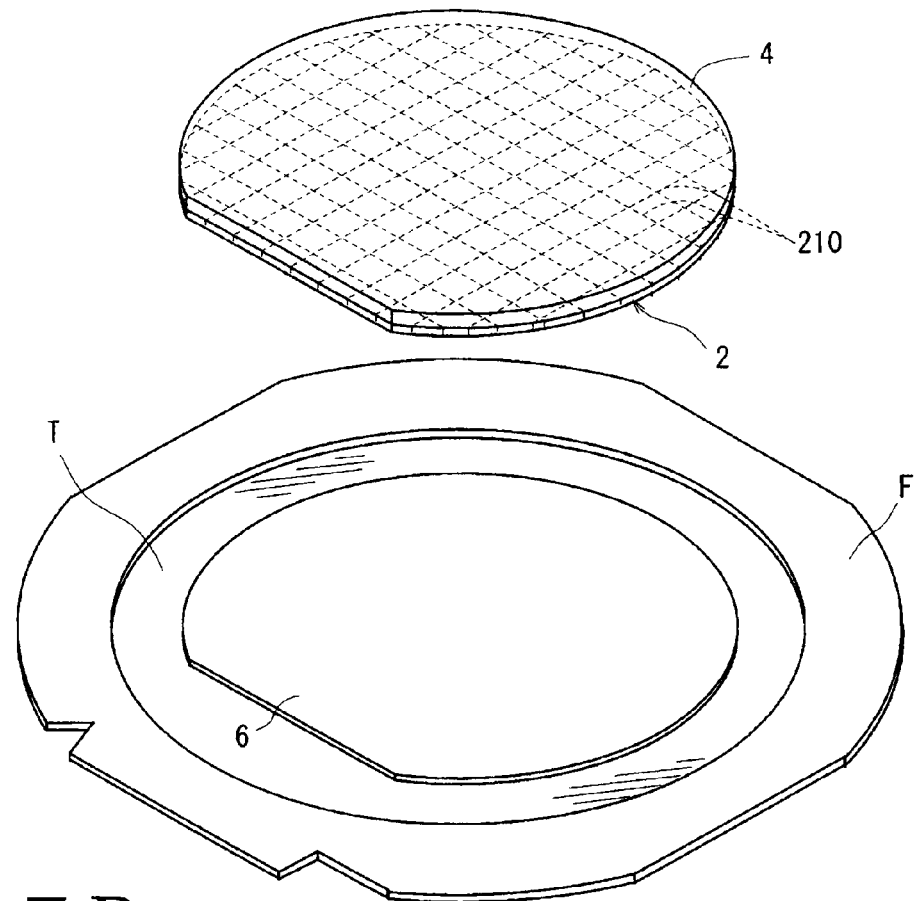
FIGS. 7A and 7B are explanatory views showing another embodiment of an adhesive film attaching step in the device manufacturing method in the present invention.
Figure 7B:
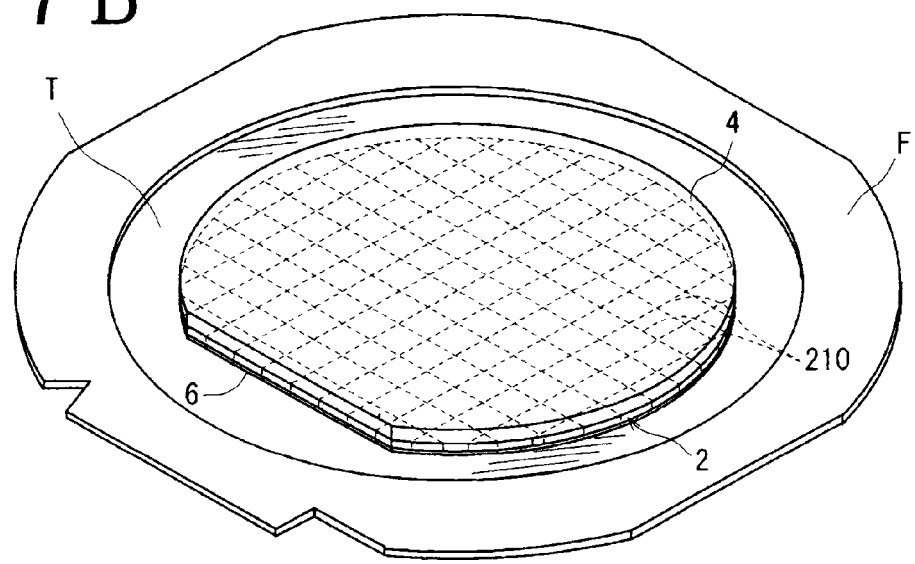

The adhesive film attaching step and wafer supporting step described above are described according to another embodiment with reference to FIGS. 7A and 7B. This embodiment uses a dicing tape with adhesive film which is previously applied to the front surface of a dicing tape T. Specifically, as illustrated in FIGS. 7A and 7B, the semiconductor wafer 2 divided into the individual devices 22 is attached on the side of the rear surface 2*b* to the adhesive film 6 which has been applied to the front surface of the dicing tape T attached at the outer circumferential portion so as to cover the inner opening portion of the annular frame F. In this case, while heating the adhesive film 6 at a temperature of 80 to 200° C., the adhesive film 6 is pressed against and attached to the rear surface 2*b* of the semiconductor wafer 2. Incidentally, the dicing tape T mentioned above is composed of a polyolefin sheet with a thickness of 95 μm in the illustrated embodiment. In the case of using the dicing tape with adhesive film as described above, the semiconductor wafer 2 is attached from the rear surface 2*b* to the adhesive film 6 applied to the front surface of the dicing tape T. Thus, the semiconductor wafer 2 attached with the adhesive film 6 is supported by the dicing tape T attached to the annular frame F.

After the adhesive film attaching step and the wafer support step described above have been performed, a separation groove forming step is performed. In this separation groove forming step, a laser beam is directed to the adhesive film 6 along a cut groove 210 from the side of the dicing tape T applied to the front surface of the semiconductor wafer 2 supported by the dicing tape T. Thus, separation grooves are formed along the respective cut grooves 6 on the adhesive film 6. The separation groove forming step is performed by a laser processing device 7 illustrated in FIG. 8. The laser processing device 7 illustrated in FIG. 8 includes a chuck table 71 adapted to hold a workpiece; a laser beam irradiation means 72 for emitting a laser beam to the workpiece held on the chuck table 71; and an image picking-up means 73 for picking up an image of the workpiece held on the chuck table 71. The chuck table 71 is configured to suck and hold the workpiece and to be shifted in a processing-transfer direction indicated with arrow X and in an indexing-transfer direction indicated with arrow Y in FIG. 8 by a shifting mechanism not illustrated.

The laser beam irradiation means 72 emits a pulse laser beam from a collector 722 attached to the leading end of a cylindrical casing 721 arranged in a substantially horizontal manner. The image picking-up means 73 is attached to the leading end of the casing 721 constituting part of the laser beam irradiation means 72. In addition, the image picking-up means 73 includes an infrared illuminating means for emitting infrared rays to a workpiece; an optical system adapted to capture the infrared rays emitted from the infrared illuminating means; and an image pickup device (the infrared CCD) adapted to output an electric signal corresponding to the infrared rays captured by the optical system; as well as a usual image pickup device (CCD) adapted to pick up an image using a visible beam. The image picking-up means sends the signal of the picked up image signal to the control means not illustrated.

Figure 8:
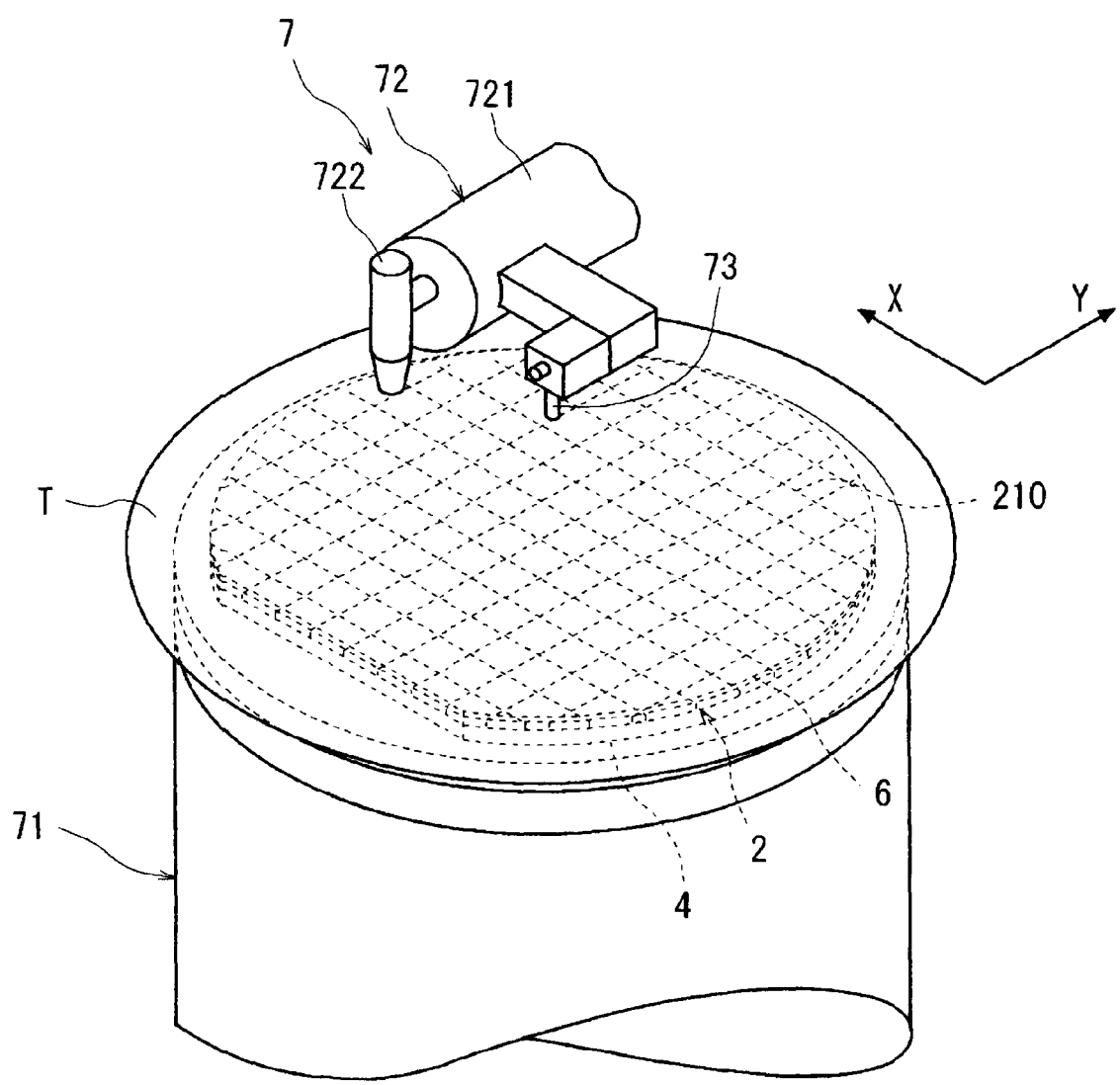
FIG. 8 is a perspective view of a laser processing device for performing a separation groove forming step in the device manufacturing method according to the present invention.
Figure 9:
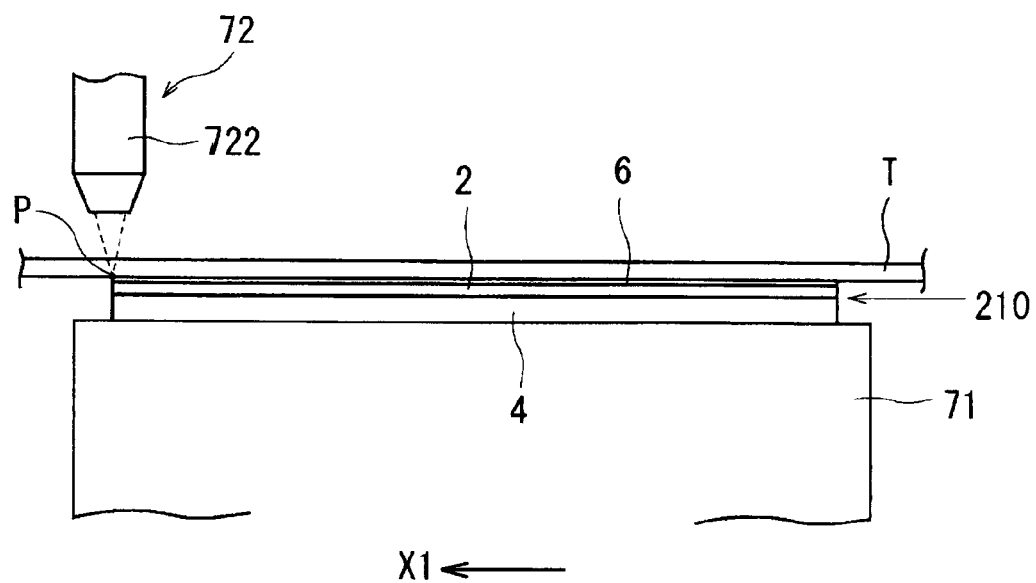
FIG. 9 is an explanatory view of the separation groove forming step in the device manufacturing method according to the present invention.

The separation groove forming step performed using the laser processing device 7 is described with reference to FIGS. 8 to 10. In the separation groove forming step, as illustrated in FIG. 8, the semiconductor wafer 2 is first placed on the chuck table 71 with the rigid plate 4 facing the chuck table 71 and then sucked and held, the rigid plate 4 being applied to the front surface of the semiconductor wafer 2. In this case, the semiconductor wafer 2 is applied on the rear surface side to the front surface of the dicing tape T via the adhesive film 6. Thus, the dicing tape T applied with the adhesive film attached to the rear surface 2b of the semiconductor wafer 2 faces upward. Incidentally, although the annular frame F attached with the dicing tape T is omitted in the illustration of FIG. 8, it is secured by means of appropriate clamps arranged on the chuck table 71.

The chuck table 71 sucking and holding the semiconductor wafer 2 as described above is positioned immediately below the image picking-up means 73 by an shifting mechanism not illustrated. After the chuck table 71 has been positioned immediately below the image picking-up means 73, alignment work is performed. In the alignment work, a process area, to be laser-processed, of the adhesive film 6 attached to the rear surface 2b of the semiconductor wafer 2 are detected by the image picking-up means 73 and the control means not illustrated. Specifically, the image picking-up means 73 and the control means perform image processing such as pattern matching or the like for performing positioning between the cut groove 210 and the controller 722 of the laser beam irradiation means 72 for emitting a laser beam along the cut groove 210, thereby performing the alignment of the laser beam irradiation position.

Similarly, the alignment of the laser beam irradiation position is performed also on the cut groove 210 formed in the direction perpendicularly to the given direction formed on the semiconductor wafer 2. In this case, since the adhesive film 6 attached to the rear surface 2b of the semiconductor wafer 2 divided into the individual devices 22 and the dicing tape T may be opaque, the cut groove 210 cannot be recognized. In such a case, the image picking-up means 73 is used that is composed of the infrared illuminating means, the optical system adapted to capture infrared rays, and the image pickup device (the infrared CCD) which outputs an electric signal corresponding to the infrared rays. This makes it possible to pick up an image of the cut groove 210 through the dicing tape T and the adhesive film 6.

After the alignment of the laser beam irradiation position has been performed as described above, the chuck table 71 is shifted to a laser beam irradiation area where the collector 722 of the laser beam irradiation means 72 for emitting a laser beam is located. Thus, as illustrated in FIG. 9, one end (the left end in FIG. 9) of a given cut groove 210 is positioned immediately below the collector 722 of the laser beam irradiation means 72. While the collector 722 emits a laser beam having a wavelength that is not absorbed by the dicing tape T but absorbed by the adhesive film 6, the chuck table 71, i.e., the semiconductor wafer 2 is made to shift at a given transfer speed in the direction indicated with arrow X1 in FIG. 9. When the other end of the cut groove 210 (the right end in FIG. 9) reaches the irradiation position of the collector 722, the irradiation of the pulse laser beam is stopped and the shifting of the chuck table 71, i.e., the semiconductor wafer 2 is stopped. In this case, the pulse laser beam to be emitted from the collector 722 of the laser beam irradiation means 72 is emitted with a light focusing point p (the point where a light focusing spot diameter is formed) allowed to coincide with the upper surface of the adhesive film 6. Incidentally, the wavelength of the laser beam is set at 355 nm that is not absorbed by the polyolefin sheet forming the dicing tape T but absorbed by the film material made of an epoxy-based resin forming the adhesive film 6. However, the wavelength of the laser beam is appropriately set depending on the relationship between material selected as a dicing tape and material selected as an adhesive film.

Figure 10:
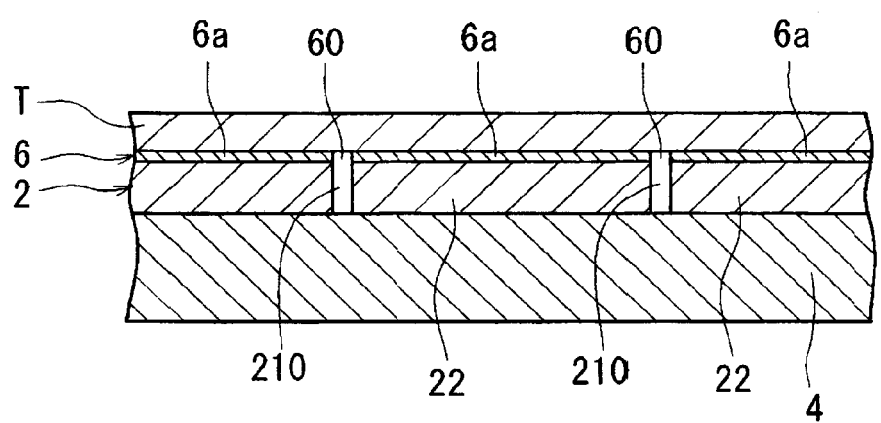
FIG. 10 is an essential portion-enlarged cross-sectional view illustrating a state where the device manufacturing method is performed illustrated in FIG. 9.

As a result, the adhesive film 6 is fusion-cut along the cut groove 210 by the energy of the laser beam passing through the dicing tape T to be formed with a separation groove 60 as illustrated in FIG. 10. In the separation groove forming step, as illustrated in FIG. 10, the adhesion film may fully be fusion-cut to form a through-groove 60. However, in a picking-up step described later, the adhesion film 6 may be formed with incomplete through-holes which serve as starting points for fracturing and dividing the semiconductor wafer 2 along the respective individual devices. When the adhesive film 6 is fusion-cut as described above, debris fly off. However, since the rigid plate 4 is applied to the front surface 2a of the semiconductor wafer 2, the flying debris will not attach to the devices formed on the front surface 2a of the semiconductor wafer 2. Incidentally, since the rigid plate 4 is attached to the front surface 2a of the semiconductor wafer 2 when the separation groove forming step is performed, the individually divided devices 22 will not be shifted. Therefore, a gap resulting from the cut groove 210 formed along the street 21 will not meander. Thus, the laser beam can be emitted along the cut groove 210.

Incidentally, for example, processing conditions in the separation groove forming step are set as below.

| | |
|---|---|
| Light source: | LD pumped Q switch Nd: YVO4 laser |
| Wavelength: | 355 nm |
| Average output: | 3 W |
| Pulse width: | 10 nm |
| Repetition frequency: | 50 kHz |
| Light Focusing spot diameter: | φ5 μm |
| Processing-transfer speed: | 100 mm/sec |

After the adhesive film 6 has been formed with the separation groove along the cut groove 210 in the given direction, the chuck table 71 is indexing-transferred by an interval between the cut grooves 210 in the direction indicated with arrow Y (see FIG. 8) and the separation groove forming step is performed. In this way, the separation groove forming step and the indexing-transfer are performed on all the cut grooves 210 formed in the given direction. Thereafter, the chuck table 71 is turned by 90 degrees and the separation groove forming step and the indexing-transfer are performed along the cut groove 210 formed perpendicular to the given direction. In the case of forming the through-grooves 60 as illustrated in FIG. 10, the adhesive film 6 is divided into adhesive films 6a attached to respective devices 22 resulting from the semiconductor wafer 2 divided by the cut grooves 210.

Figure 11:
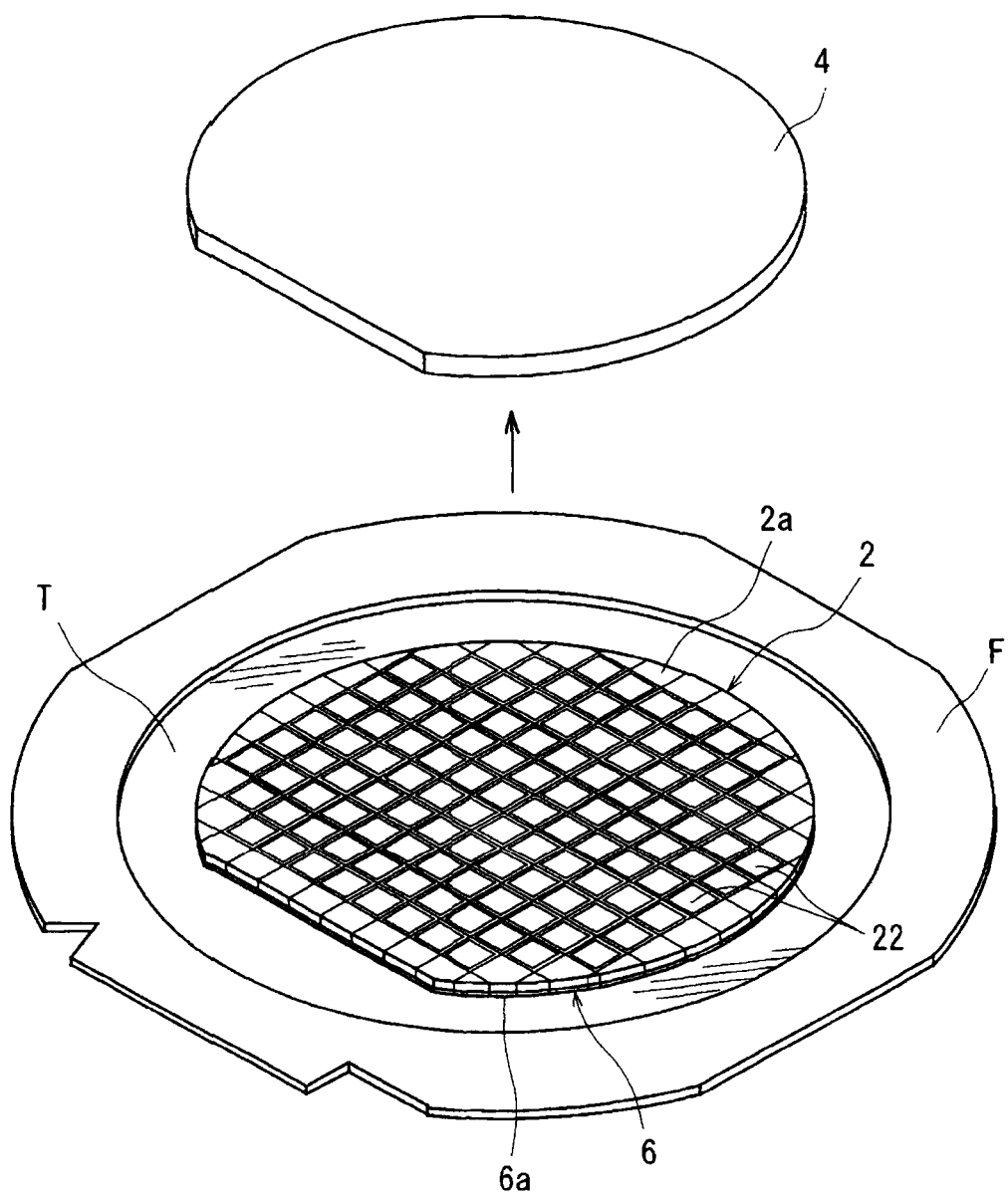
FIG. 11 is an explanatory view of a protection tape peeling step in the device manufacturing method according to the present invention.

After the separation groove forming step described above has been performed, a rigid plate peeling step is performed in which the rigid plate 4 applied to the front surface 2a of the semiconductor wafer 2 is peeled off. Specifically, the rigid plate 4 is peeled off which is applied to the front surface 2a of the semiconductor wafer 2 applied to the front surface of the dicing tape T attached to the annular frame F as illustrated in FIG. 11.

Figure 12:
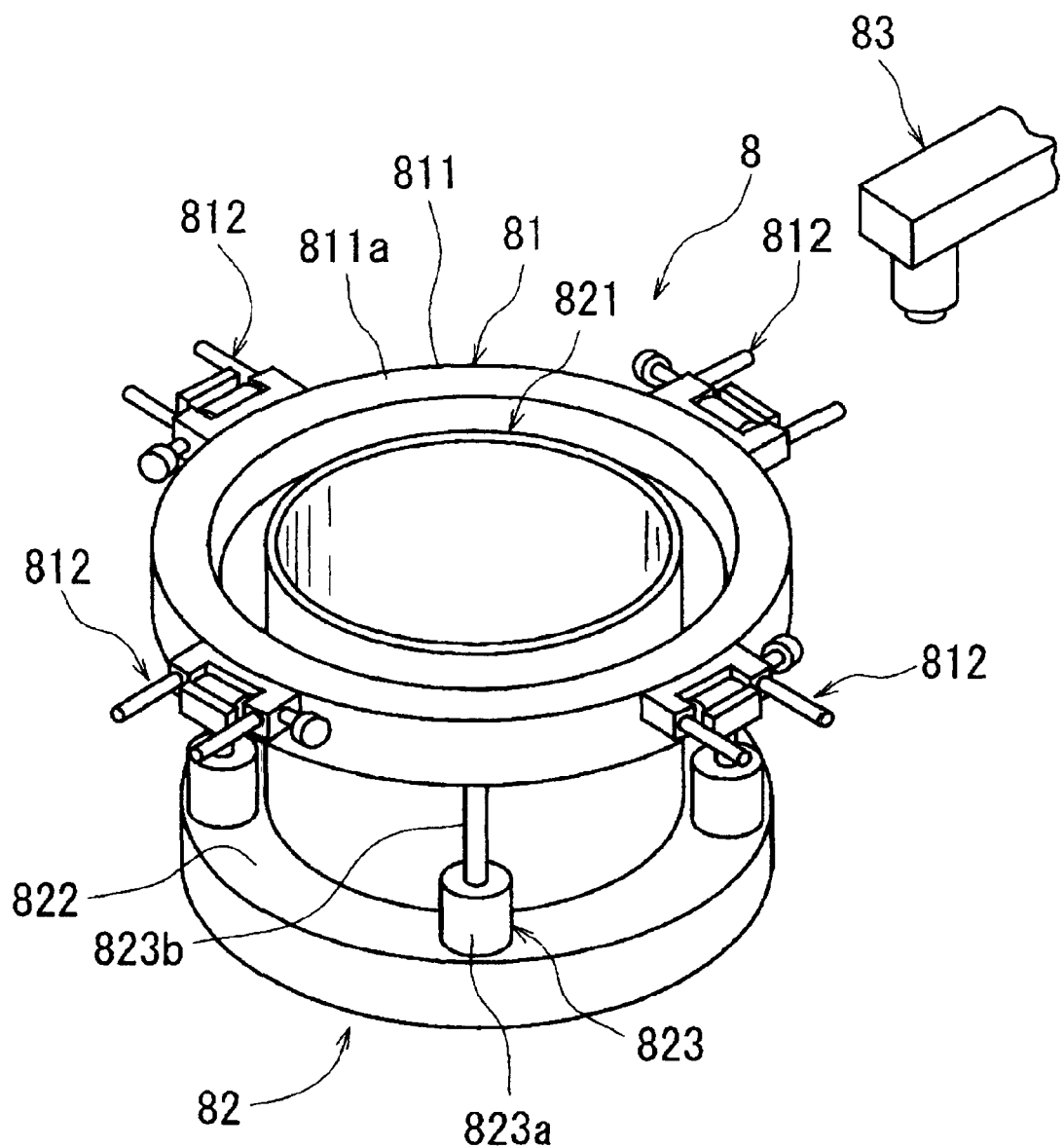
FIG. 12 is a perspective view of a picking-up device for executing a picking-up step in the device manufacturing method according to the present invention.

Next, a picking-up step is performed in which the devices 22 are peeled off and picked up from the dicing tape T, the devices 22 being attached with the adhesive films 6a fusion-cut along the cut grooves 210 by performing the separation groove forming step described above. The picking-up step is performed using a picking-up device 8 illustrated in FIG. 12. The picking-up device 8 illustrated in FIG. 12 includes a frame holding means 81 for holding the annular frame F; a tape expanding means 82 for expanding the dicing tape T attached to the annular frame F held by the frame holding means 81; and a pickup collet 83. The frame holding means 81 includes an annular frame holding member 811; and a plurality of clamps 812 as securing means arranged on the outer circumference of the frame holding member 811. The upper surface of the frame holding member 811 is formed as a placing surface 811a on which the annular frame F is placed. The annular frame F placed on the placing surface 811a is secured to the frame holding member 811 by means of the clamps 812. The frame holding means 81 configured as above is supported by the tape expanding means 82 so as to vertically advance and retreat.

Figure 13A:
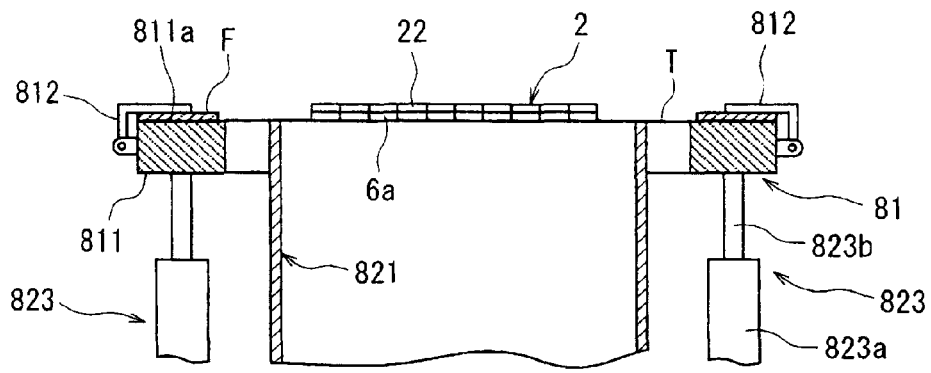
FIGS. 13A to 13C are explanatory views of the picking-up step in the device manufacturing method according to the present invention.
Figure 13B:
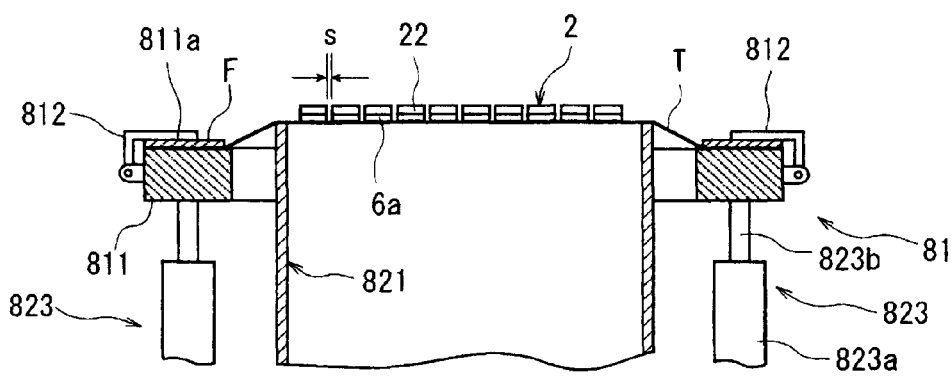

The tape expanding means 82 includes an expansion drum 821 disposed inside the annular frame holding member 811. This expansion drum 821 has an inner diameter and an outer diameter smaller than the inner diameter of the annular frame F and larger than the outer diameter of the semiconductor wafer 2 applied to the dicing tape T attached to the annular frame F. The expansion drum 821 is provided with a support flange 822 at the lower end. The tape expansion means 82 is provided with a support means 823 capable of vertically advancing and retreating the annular frame holding member 811. The support means 823 is composed of a plurality of air cylinders 823a disposed on the support flange 822. Respective piston rods 823b of the air cylinders 823a are connected to the lower surface of the annular frame holding member 811. The support means 823 composed of the plurality of air cylinders 823a allows the annular frame holding member 811 to vertically shift between a reference position and an expansion position. The reference position is such that the placing surface 811a has a height substantially equal to that of the upper end of the expansion drum 821 as illustrated in FIG. 13A. The expansion position is lower than the upper end of the expansion drum 821 by a given amount as illustrated in FIG. 13B.

Figure 13C:
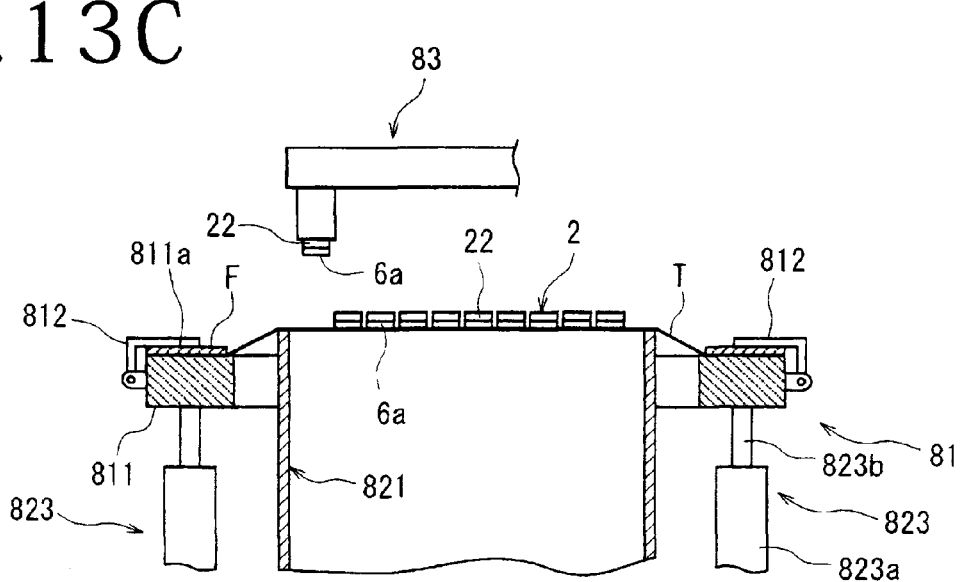

The picking-up step performed using the picking-up device 8 configured as above is described with reference to FIGS. 13A to 13C. The annular frame F attached with the dicing tape T applied with the semiconductor wafer 2 (divided into the individual devices 22 along the streets 21) is placed on the placing surface 811a of the frame holding member 811 constituting the frame holding means 81 and secured to the frame holding member 811 by means of the clamps 812 (the frame holding step). In this case, the frame holding member 811 is positioned at the reference position illustrated in FIG. 13A. Next, the plurality of air cylinders 823a as the support means 823 constituting the tape expansion means 82 are operated to lower the annular frame holding member 811 to the expansion position illustrated in FIG. 13B. Thus, also the annular frame F secured onto the placing surface 811a of the frame holding member 811 is lowered. This brings the dicing tape T attached to the annular frame F into contact with the upper end edge of the expansion drum 821 for expansion (the tape expansion step).

As a result, between the adhesive films 6 applied to the dicing tape T and between the devices 22 applied to the adhesive films 6 are broadened, that is, intervals S are enlarged. Incidentally, the separation groove formed in the adhesive film 6 may not be the through-groove but the incomplete through-groove in the separation groove forming step. In such a case, the dicing tape T is expanded in the tape expanding step, whereby the incomplete through-groove serves as a starting point for fracture to separate the adhesive tape 6 along the devices 22. Next, as illustrated in FIG. 13C, the picking-up collet 83 is operated to attract the device 22 (attached with the adhesive film 6a on the rear surface), peel it off from the dicing tape T and pick it up. Then, the picking-up collet 83 conveys the device 22 to a tray not illustrated or to a die bonding step. Incidentally, when the picking-up step is performed, the dicing tape T is irradiated with ultraviolet rays to lower its adhesion. In the picking-up step described above, the gap S between the individual devices 22 attached with the adhesive film 6 is broadened as described above. Therefore, the device 22 can easily be picked up without contact with device adjacent thereto.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor device manufacturing method in which a wafer formed with devices in a plurality of respective areas sectioned by a plurality of streets formed in a lattice-like pattern on a front surface is divided into the individual devices along the streets, comprising:
   a cut groove forming step of forming cut grooves each having a depth corresponding to a finish thickness of the device along the streets from a front surface side of the wafer;
   a rigid plate applying step of applying a rigid plate to the front surface of the wafer formed with the cut grooves;
   a wafer dividing step of grinding a rear surface of the wafer applied with the rigid plate to expose the cut grooves to the rear surface and dividing the wafer into the individual devices;
   an adhesive film attaching step of attaching an adhesive film to the rear surface of the wafer divided into the individual devices and allowing a dicing tape attached to an annular frame to support the wafer attached with the adhesive film;
   a separation groove forming step of, after the adhesive film attaching step has been performed, emitting a laser beam to the adhesive film along the cut grooves from the dicing tape side to form separation grooves in the adhesive film along the cut grooves;
   a rigid plate peeling step of, after the separation groove forming step has been performed, peeling the rigid plate applied to the front surface of the wafer; and
   a picking-up step of peeling off and picking up the devices from the dicing tape, the devices each being attached with the adhesive film formed with separation grooves along the respective cut grooves by performing the separation groove forming step.

2. The semiconductor device manufacturing method according to claim 1,
   wherein the picking-up step is performed by expanding the dicing tape to broaden a gap between the individually divided devices.

* * * * *